(12) United States Patent
Cooney, III et al.

(10) Patent No.: US 9,196,592 B2
(45) Date of Patent: Nov. 24, 2015

(54) METHODS OF MANAGING METAL DENSITY IN DICING CHANNEL AND RELATED INTEGRATED CIRCUIT STRUCTURES

(71) Applicant: International Business Machines Corporation, Armonk, NY (US)

(72) Inventors: Edward C. Cooney, III, Jericho, VT (US); Jeffrey P. Gambino, Westford, VT (US); Richard S. Graf, Gray, ME (US); Gary L. Milo, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 14/152,503

(22) Filed: Jan. 10, 2014

(65) Prior Publication Data

US 2015/0200167 A1    Jul. 16, 2015

(51) Int. Cl.
*H01L 23/544* (2006.01)
*H01L 23/58* (2006.01)
*H01L 21/78* (2006.01)

(52) U.S. Cl.
CPC .............. *H01L 23/585* (2013.01); *H01L 21/78* (2013.01); *H01L 23/544* (2013.01); *H01L 2223/5446* (2013.01)

(58) Field of Classification Search
None
See application file for complete search history.

(56) References Cited

U.S. PATENT DOCUMENTS

| 6,259,164 | B1 | 7/2001 | Batterson et al. |
|---|---|---|---|
| 7,112,470 | B2 | 9/2006 | Daubenspeck et al. |
| 7,494,898 | B2 | 2/2009 | Sunohara et al. |
| 7,541,218 | B2 | 6/2009 | Hsu |
| 7,926,006 | B2 | 4/2011 | Bailey et al. |
| 8,309,957 | B2 | 11/2012 | Chatterjee et al. |
| 2007/0108638 | A1 | 5/2007 | Lane et al. |
| 2010/0283128 | A1 | 11/2010 | Chen |
| 2011/0124156 | A1 | 5/2011 | Do et al. |

FOREIGN PATENT DOCUMENTS

WO    WO03044841    5/2003

OTHER PUBLICATIONS

Park ("High-speed laser wafer scribing", Industrial Laser Solutions for Manufacturing, Apr. 1, 2005).*
"Reliability improvement of 90nm large flip chip low-k die via dicing and assembly process optimization" Chaware, R.; Lan Hoang Electronics Packaging Technology Conference, 2006. EPTC '06. 8th Digital Object Identifier: 10.1109/EPTC.2006.342785 Publication Year: 2006, pp. 622-626.
"300-mm Low-k Wafer Dicing Saw Development" Zhijie Wang; Wang, J.H.; Lee, S.; Suying Yao; Han, R.; Su, Y.Q. Electronics Packaging Manufacturing, IEEE Transactions on vol. 30, Issue: 4, Publication Year: 2007, pp. 313-319 Digital Object Identifier: 10.1109/TEPM.2007.906488.
"Chipping free process for combination of narrow saw street (60um) and thick wafer (600um) sawing process" Amri, M.S.; Liew, D.; Harun, F. Electronic Manufacturing Technology Symposium (IEMT), 2010 34th IEEE/CPMT International Digital Object Identifier: 10.1109/IEMT.2010.5746667 Publication Year: 2010, pp. 1-5.

* cited by examiner

*Primary Examiner* — Yasser A Abdelaziez
(74) *Attorney, Agent, or Firm* — Anthony J. Canale; Hoffman Warnick LLC

(57) ABSTRACT

Various embodiments include managing metal densities in kerf sections of an integrated circuit (IC) wafer. In some embodiments, a method includes: forming an integrated circuit (IC) wafer including a wafer kerf region, the wafer kerf region having a metal density of less than approximately 0.5 percent relative to a total density of the wafer kerf region.

14 Claims, 4 Drawing Sheets

METHODS OF MANAGING METAL DENSITY IN DICING CHANNEL AND RELATED INTEGRATED CIRCUIT STRUCTURES

BACKGROUND

The subject matter disclosed herein relates to integrated circuit devices. More particularly, the subject matter relates to fabrication of integrated circuit devices.

As integrated circuit technologies have advanced, the size of these devices has correspondingly decreased. In particular, as devices are reduced in scale to comply with ever-smaller packaging, tighter constraints are applied to their dimensions and spacings.

Integrated circuit (IC) chips are formed by fabricating a plurality of devices on a wafer, and dicing the wafer along kerf lines separating the devices, to form a plurality of individual chips. However, as IC chips have become thinner, the silicon-to-metal ratio in the kerf area of the wafers makes dicing of those chips more cumbersome, more time consuming and potentially damaging to the surrounding wafer.

SUMMARY

Various embodiments include managing metal densities within dicing channels in an integrated circuit (IC) wafer. In some embodiments, a method includes: forming an integrated circuit (IC) wafer including a wafer kerf region, the wafer kerf region having a metal density of less than approximately 0.5 percent relative to a total density of the wafer kerf region.

A first aspect includes a method including: forming an integrated circuit (IC) wafer including a wafer kerf region, the wafer kerf region having a metal density of less than approximately 0.5 percent relative to a total density of the wafer kerf region.

A second aspect includes an integrated circuit (IC) wafer comprising: a wafer kerf region, the wafer kerf region having a metal density of less than approximately 0.5 percent relative to a total density of the wafer kerf region.

A third aspect includes a method of forming a wafer kerf region, the method including: forming an integrated circuit (IC) wafer kerf region substrate including a substrate material; and forming a kerf process region over the IC wafer kerf region substrate, wherein the kerf process region is formed to include at least one metal having a metal density of less than approximately 0.5 percent relative to a combined thickness of the IC wafer kerf region substrate and the kerf process region as measured along an axis of dicing of the wafer kerf region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
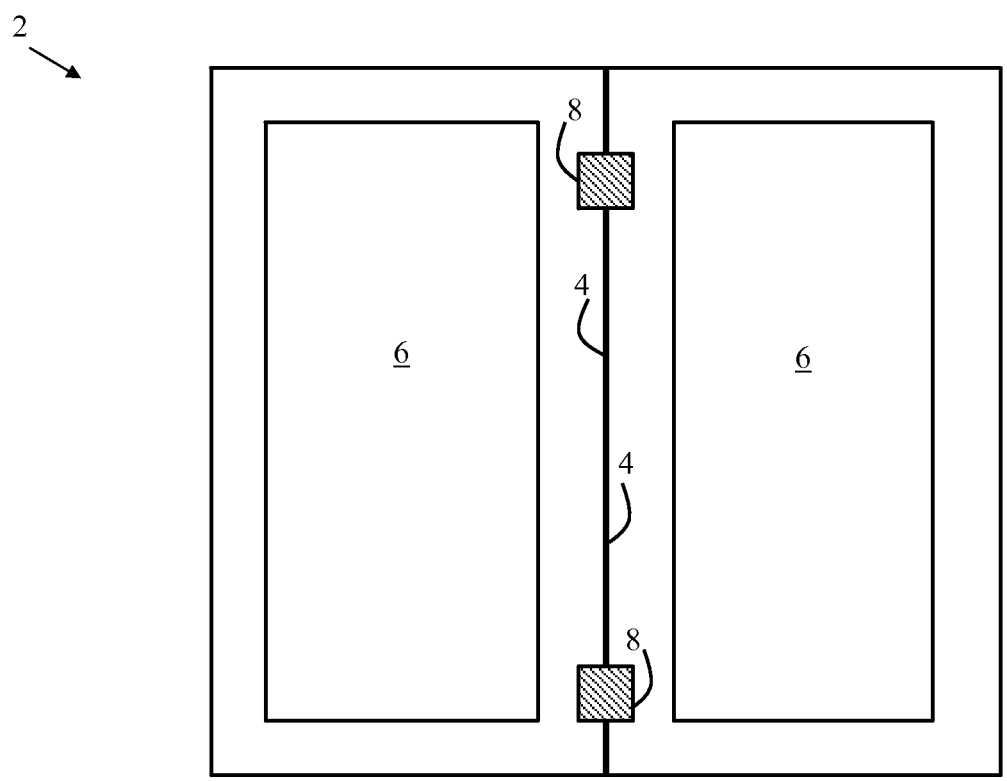
FIG. 1 shows a schematic top view of an integrated circuit (IC) wafer according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to fabrication of integrated circuit devices.

As noted herein, integrated circuit (IC) chips are formed by fabricating a plurality of devices on a wafer, and dicing the wafer along kerf lines separating the devices, to form a plurality of individual chips. However, as IC chips have become thinner, the silicon-to-metal ratio in the kerf area of the wafers makes dicing of those chips more cumbersome and time consuming. That is, conventional dicing saws are designed for dicing wafers having a high silicon-to-metal ratio; and more modern wafers, with a lower silicon-to-metal ratio, have less silicon to clean the dicing saw from the build-up of metal and polysilicon. During dicing, this lower silicon-to-metal ratio reduces the efficiency of dicing, causing build-up on the dicing saw.

According to various embodiments, methods include managing metal density/content of the dicing channels in wafer kerf regions prior to dicing of the IC chips from the wafer. Various methods include forming IC wafers (including chips) that have a predetermined metal density in the kerf region. These methods can enhance the dicing efficiency of traditional dicing saws in cutting the IC chips from wafers formed according to various embodiments.

Various particular embodiments include a method including: forming an integrated circuit (IC) wafer including a wafer kerf region, the wafer kerf region having a metal density of less than approximately 0.5 percent relative to a total density of the wafer kerf region.

Various additional embodiments include an integrated circuit (IC) wafer having: a wafer kerf region, the wafer kerf region having a metal density of less than approximately 0.5 percent relative to a total density of the wafer kerf region.

Various other embodiments include a method of forming a wafer kerf region, the method including: forming an integrated circuit (IC) wafer kerf region substrate including a substrate material; and forming a kerf process region over the IC wafer kerf region substrate, wherein the kerf process region is formed to include at least one metal having a metal density of less than approximately 0.5 percent relative to a density of the combined IC wafer kerf region substrate and the kerf process region.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 2:
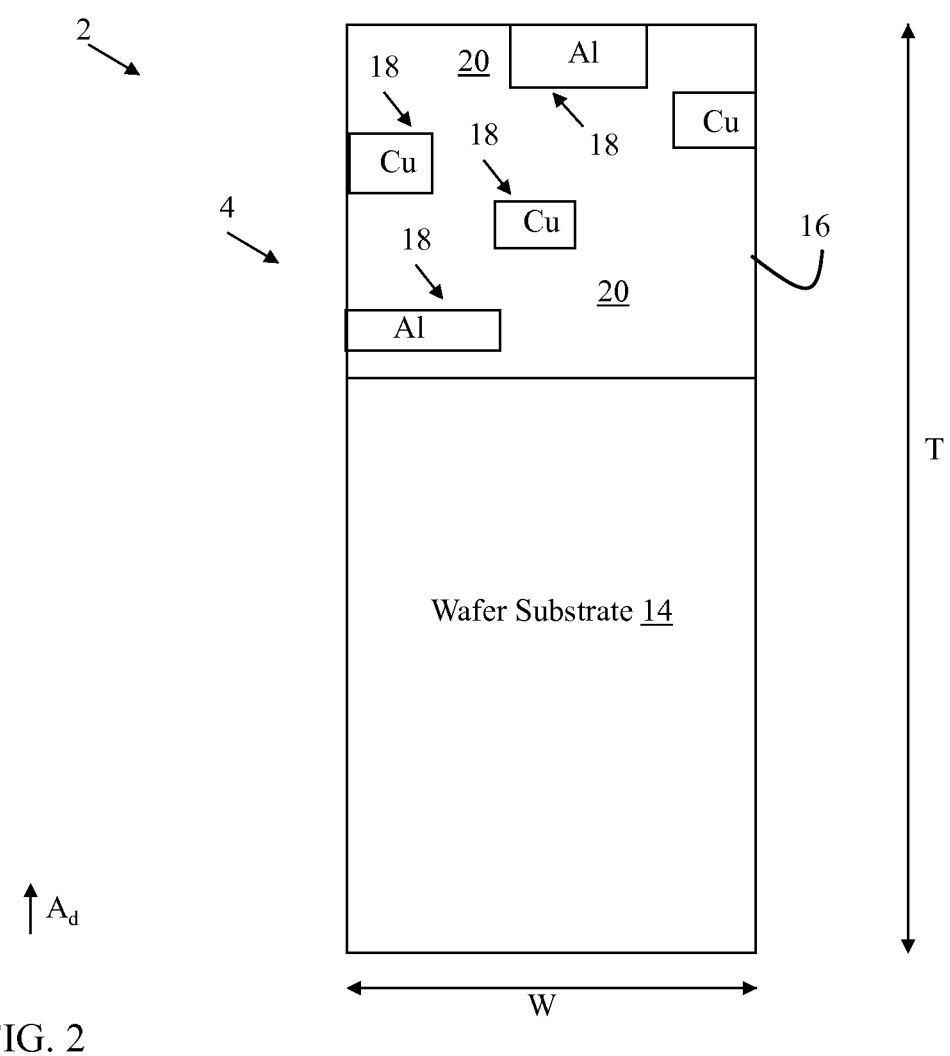
FIG. 2 shows a schematic cross-sectional view of a wafer kerf region from the IC wafer in FIG. 1.
Figure 3:
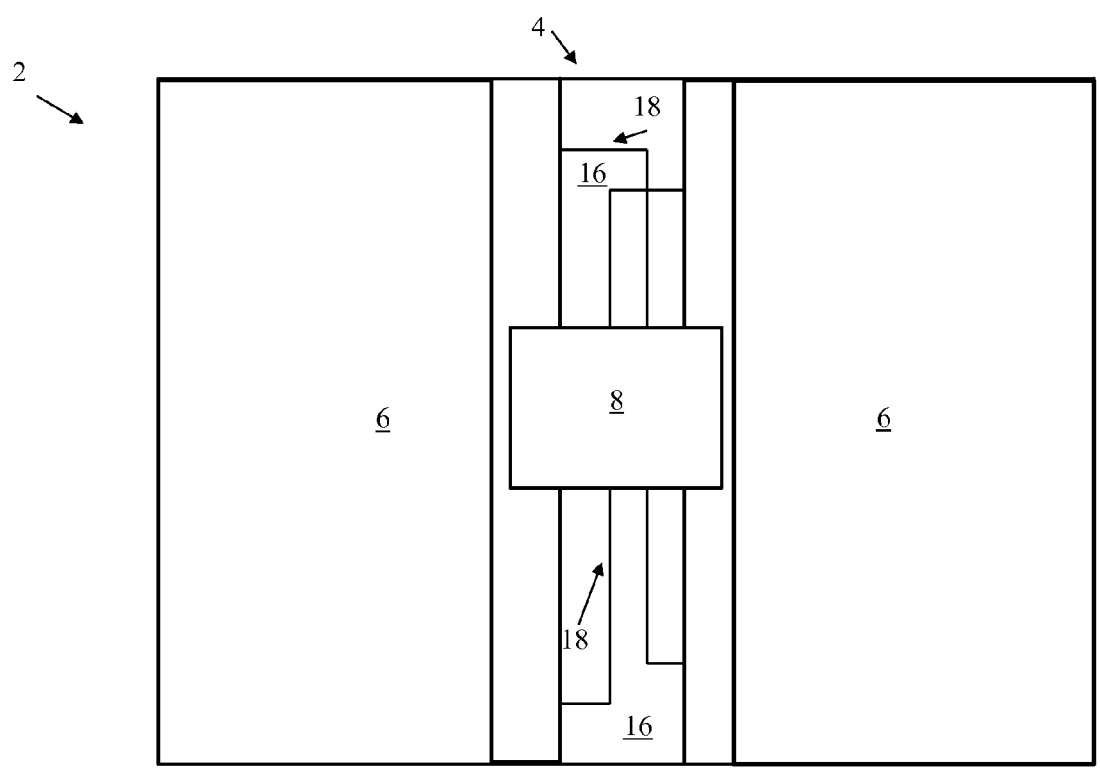
FIG. 3 shows a close-up schematic top view of the IC wafer 2 of FIGS. 1 and 2.

FIG. 1 shows a schematic top view of an integrated circuit (IC) wafer 2 according to various embodiments. FIG. 2 shows a schematic side view of the IC wafer 2 of FIG. 1; and FIG. 3 shows a close-up schematic top view of the IC wafer 2 of FIGS. 1 and 2. Referring to FIGS. 1-3, the IC wafer 2 can include a wafer kerf region 4 separating adjacent IC chips 6 prior to dicing of those IC chips 6 for end use. In some cases, the IC wafer 2 can include a probe pad 8. The probe pad 8 can include a conductive pad (e.g., copper, aluminum, etc.) that is electrically connected with a metal interconnect (not shown).

FIG. 2 shows a close-up cross-sectional view of the wafer kerf region 4 in the IC wafer 2 of FIG. 1. As is known in the art, the wafer kerf region 4 can define a separation between adjacent IC chips 6 for subsequent dicing (cutting) of the IC chips 6, prior to packaging, shipment, use, etc. of those IC chips 6. As used herein, the term "wafer kerf region" refers to a dicing designed to be sawed in order to separate adjacent IC chips 6. According to various embodiments, the wafer kerf region 4 has a width (W) equal to approximately the width of a dicing saw used for dicing adjacent IC chips 6.

In various embodiments, the wafer kerf region 4 can include a substrate 14 including a dielectric, e.g., at least one of: silicon dioxide ($SiO_2$), silicon oxygen fluoride (SiOF), silicon nitride (SiN), silicon carbide (SiC), carbo-silicon nitride (C—SiN), cadmium oxide (CdO) or combinations thereof. In some cases, where the substrate 14 includes an inter-level dielectric (ILD) layer, that ILD can include at least one of: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

In various embodiments, the wafer kerf region 4 also includes a process region 16 overlying the wafer substrate 14. The process region 16 can include an insulator 20, e.g., a silicon-based insulator and/or other conventional insulator material, along with at least one metal 18. The at least one metal 18 can include at least one copper wire (Cu) and/or at least one aluminum wire (Al).

According to various embodiments the density of the at least one metal 18 is less than approximately 0.5 percent of a density of the wafer kerf region 4. According to various embodiments, a metal density of less than approximately one (1) percent of the total density of the IC wafer 2 in the kerf 4 can improve dicing efficiency, and reduce damage to dicing equipment and adjacent IC chips 6 when compared with conventional wafer kerf region compositions. In particular embodiments, the metal density is equal to or less than approximately 0.5 percent, which can improve dicing efficiency, and reduce damage to dicing equipment and adjacent IC chips 6 when compared with conventional wafer kerf region compositions. In various embodiments, the process region 16 contains the at least one metal 18, such that the at least one metal 18 does not span to the wafer substrate 14.

In some particular embodiments, where the at least one metal 18 includes at least one copper wire (Cu), the at least one copper wire (Cu) has a thickness of at least approximately 3 microns as measured along an axis of dicing ($A_d$) of the wafer kerf region 4. The axis of dicing ($A_d$) is the direction in which a dicing saw may cut the wafer kerf region 4 to separate adjacent IC chips 6. In some particular embodiments, where the at least one metal 18 includes at least one aluminum wire (Al), the at least one aluminum wire (Al) has a thickness (in direction T) of at least 4 microns as measured along the axis of dicing ($A_d$) of the wafer kerf region 4.

It is understood that as described herein, the IC wafer 2 can include a post-test wafer. That is, the IC wafer 2 shown and described according to various embodiments, has completed performance testing and is otherwise ready for dicing prior to the processes illustrated herein.

Figure 4:
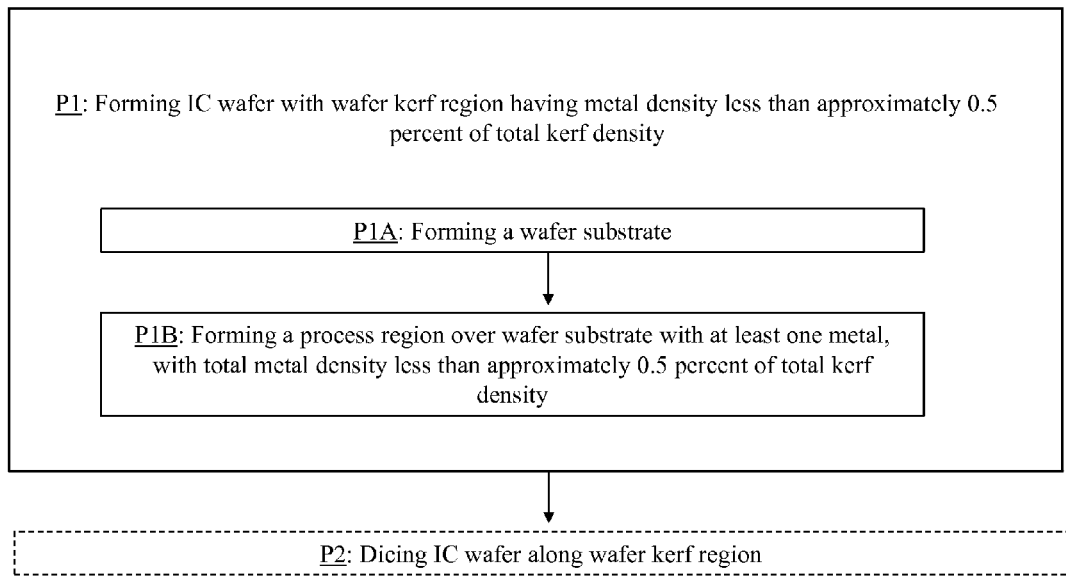
FIG. 4 depicts a flow diagram illustrating processes according to various embodiments.

FIG. 4 is a flow diagram illustrating processes performed according to various embodiments. The flow diagram of FIG. 4 will be described with reference to the schematic depictions of the IC wafer 2 in FIGS. 1-3. In some embodiments, a process according to various embodiments can include, process P1: forming an integrated circuit (IC) wafer 2 including a wafer kerf region 4 with a metal density of less than approximately 0.5 percent relative to a total density (T) of the wafer kerf region 4.

According to various embodiments, process P1 can include a plurality of sub-processes such as:

Process P1A: forming a wafer substrate 14. In various embodiments a wafer substrate 14 may be obtained as a bulk substrate material, or may be formed by conventional deposition processes.

Process P1B: forming a process region 16 over the wafer substrate 14. According to various embodiments, the process region can contain the metal (e.g., metal 18) having a metal density of less than approximately 0.5 percent relative to the total density of the wafer kerf region 4. In some embodiments, the process region can be formed by depositing the insulator 20 over the wafer substrate 14 and using conventional masking/etching/deposition techniques to create distinct metals (e.g., metal lines) 18 within the insulator 20. In various embodiments, the at least one metal 18 is deposited within the insulator 20 according to known techniques. In some cases, the at least one metal 18 includes at least one copper wire (Cu) and/or at least one aluminum wire (Al). In the case that the metal 18 includes at least one copper wire (Cu), each copper wire (Cu) is approximately 3 microns thick (measured along direction T). In the case that the metal includes at least one aluminum wire (Al), each aluminum wire (Al) is approximately 4 microns thick (measured along direction T).

In various embodiments, the process can also include an optional post-process, P2: dicing the IC wafer 2 along the wafer kerf region 4, e.g., to form a plurality of IC chips 6. As described herein, the process of forming the wafer kerf region 4 with a specified proportion of metal enhances the efficiency and effectiveness of this dicing process.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
   forming an integrated circuit (IC) wafer including a wafer kerf region, the wafer kerf region having a metal density of less than approximately 0.5 percent relative to a total density of the wafer kerf region, the forming of the IC wafer including:
   forming a wafer substrate;
   forming a process region over the wafer substrate, the process region containing the metal density of less than approximately 0.5 percent relative to the total density of the wafer kerf region;
   forming at least one copper wire within the process region, the at least one copper wire having a thickness of at least approximately 3 microns as measured along an axis of dicing of the wafer kerf region; and
   forming at least one aluminum wire within the process region, the at least one aluminum wire having a thickness of at least 4 microns as measured along the axis of dicing of the wafer kerf region.

2. The method of claim 1, wherein the at least one copper wire is formed having a thickness of at least approximately 3 microns as measured along an axis of dicing of the wafer kerf region.

3. The method of claim 1, wherein the at least one aluminum wire has a thickness of at least 4 microns as measured along an axis of dicing of the wafer kerf region.

4. An integrated circuit (IC) wafer comprising:
   a wafer kerf region, the wafer kerf region having a metal density of less than approximately 0.5 percent relative to a total density of the wafer kerf region;
   a wafer substrate;
   a process region overlying the wafer substrate; and
   at least one copper wire in the process region.

5. The IC wafer of claim 4, wherein
   the at least one copper wire has a thickness of at least approximately 3 microns as measured along an axis of dicing of the wafer kerf region; and
   further comprising at least one aluminum wire in the process region, the at least one aluminum wire having a thickness of at least 4 microns as measured along the axis of dicing of the wafer kerf region.

6. The IC wafer of claim 4, wherein the at least one copper wire has a thickness of at least approximately 3 microns as measured along the axis of dicing of the wafer kerf region.

7. The IC wafer of claim 4, further comprising at least one aluminum wire in the process region.

8. The IC wafer of claim 7, wherein the at least one aluminum wire has a thickness of at least 4 microns as measured along an axis of dicing of the wafer kerf region.

9. A method of forming a wafer kerf region in an integrated circuit (IC) wafer, the method comprising:
   forming an IC wafer kerf region substrate including a substrate material; and
   forming a kerf process region over the IC wafer kerf region substrate, wherein the kerf process region is formed to include at least one metal having a metal density of less than approximately 0.5 percent relative to a total density of the IC wafer kerf region substrate and the kerf process region.

10. The method of claim 9, wherein the at least one metal includes:
    at least one copper wire having a thickness of at least approximately 3 microns as measured along an axis of dicing of the wafer kerf region; and
    at least one aluminum wire having a thickness of at least 4 microns as measured along the axis of dicing of the wafer kerf region.

11. The method of claim 9, wherein the at least one metal includes at least one copper wire.

12. The method of claim 11, wherein the at least one copper wire is formed having a thickness of at least approximately 3 microns as measured along an axis of dicing of the wafer kerf region.

13. The method of claim 9, wherein the at least one metal includes at least one aluminum wire.

14. The method of claim 9, wherein the at least one aluminum wire has a thickness of at least 4 microns as measured along an axis of dicing of the wafer kerf region.

* * * * *